United States Patent

Sato et al.

[11] Patent Number: 5,359,351
[45] Date of Patent: Oct. 25, 1994

[54] THICK FILM THERMAL PRINTING HEAD

[75] Inventors: Kazutaka Sato, Kashiwa; Michihiro Watanabe, Tsuchiura; Shogo Matsumoto, Ibaraki; Hiroyuki Tobita, Katsuta, all of Japan

[73] Assignee: Hitachi, Ltd., Tokyo, Japan

[21] Appl. No.: 671,083

[22] Filed: Mar. 18, 1991

[30] Foreign Application Priority Data

Mar. 16, 1990 [JP] Japan .................... 2-066336

[51] Int. Cl.$^5$ ............................ B41J 2/335
[52] U.S. Cl. ................................. 346/76 PH
[58] Field of Search ............ 346/76 PH, 139 C; 219/543

[56] References Cited

U.S. PATENT DOCUMENTS 4,841,120 6/1989 Yagino et al. ............. 346/76 PH
4,982,201 1/1991 Seigenji ...................... 346/76 PH

FOREIGN PATENT DOCUMENTS 0232975 11/1985 Japan .
0141572 6/1986 Japan ...................... 346/76 PH
0021559 1/1987 Japan ...................... 346/76 PH Primary Examiner—Benjamin R. Fuller
Assistant Examiner—Huan Tran
Attorney, Agent, or Firm—Antonelli, Terry, Stout & Kraus

[57] ABSTRACT

A thick film thermal printing head having a substrate, an insulating glaze layer formed on the substrate, a heating resistor formed into a straight elongated shape, a driver IC for controlling energization of the heating resistor, a plurality of first lead wires for connection between the heating resistor and the driver IC, a common electrode serving as an intermediate power supply point through which electric power is supplied to the heating resistor, and a plurality of second lead wires for connection between the heating resistor and the common electrode, the first and second lead wires are alternately disposed parallel to each other, at least the first lead wires, the second lead wires and the common electrode being formed on the glaze layer. The heating resistor is formed in the vicinity of an end surface of the substrate, and the lead wires, the common electrode and the driver IC and other components are suitably arranged to form a thick film thermal printing head structure having no insulating interlayer and no through holes at the connection between the lead wires and the common electrode, enabling simplification of the manufacture process and a reduction in the manufacture cost. It is also possible to improve the printing performance of a thermal transfer facsimile apparatus or thermal transfer printer as well as to reduce the size thereof by using the thick film thermal printing head of the present invention.

18 Claims, 5 Drawing Sheets

THICK FILM THERMAL PRINTING HEAD

BACKGROUND OF THE INVENTION

This invention relates to a thick film thermal printing head suitable for reducing the size of a thermal transfer facsimile, thermal transfer printers or the like and for improving printing performance of such apparatuses.

A thick film thermal printing head, such as the one disclosed in Japanese Patent Unexamined Publication No. 60-232975, is known which has a structure in which a heating resistor is formed in close proximity to an end of a substrate. In this thick film thermal printing head, as shown in FIG. 3, a common electrode to which a plus voltage is applied from a power source is formed on an insulating interlayer formed on lead wires led from the heating resistor and connected to a driver IC and other lead wires led from the heating resistor and connected to the common electrode, and the common electrode in the form of a layer laid on the insulating interlayer and the lead wires which are located below the insulating interlayer and which are to be connected to the common electrode are electrically connected via through holes 15 formed in the insulating interlayer.

However, it is difficult to form through holes necessary for forming this structure by using the ordinary thick film manufacture process. For example, in the case of a thick film thermal head having a resolution of 8 pixels per 1 mm, it is necessary to form about 45 μm square through holes in the insulating interlayer. A photolithography process is required to form such through holes because it is difficult to form them by using a thick film manufacture process based on screen printing alone, and the overall manufacture process is thereby made complicated.

According to the above-described prior art, the common electrode to which a plus voltage is applied and the driver IC are formed on the same side of the heating resistor, the lead wires led from the heating resistor and connected to the common electrode are formed on the substrate formed of a ceramic or a metal or on a glass glaze layer formed on the substrate, and the common electrode is formed on the insulating interlayer formed of glass and provided on the lead wires led from the heating resistor. The common electrode and the lead wires are connected via through holes formed in the insulating interlayer. However, it is difficult to reduce the size of each through hole to 100 μm square or smaller if the layer forming process is based on screen printing and firing alone, and it is difficult to apply the above-described prior art to thermal transfer facsimile printing in conformity with a facsimile standard GIII mode having a resolution of 8 pixels per 1 mm necessary for forming about 45 μm square through holes. To solve this problem, there is a need for a photolithography process for forming the through holes in the insulating interlayer. However, the number of process steps is thereby increased in comparison with the ordinary thick film process using screen printing and firing, so that the overall process is complicated and that the manufacture cost is increased.

SUMMARY OF THE INVENTION

In view of these problems, a first object of the present invention is to provide a thick film thermal printing head in which the heating resistor is disposed in the vicinity of an end surface of the substrate, which is simplified in structure by suitably arranging the heating resistor, the lead wires, the common electrode and other elements formed on the substrate, that is, includes no insulating interlayer at the connection between the lead wires and the common electrode and, hence, no through holes, and which can therefore be easily manufactured by reduced process steps.

A second object of the present invention is to provide a facsimile apparatus and a printer each incorporating the thick film thermal printing head of the present invention having a simplified structure.

To achieve the first object, according to one aspect of the present invention, there is provided a thick film thermal printing head including a substrate; an insulating glaze layer formed on the substrate; a heating resistor formed into a straight elongated shape; a driver IC for controlling energization of the heating resistor; a plurality of first lead wires for connection between the heating resistor and the driver IC, the first lead wires being formed parallel to each other; a common electrode serving as an intermediate power supply point through which electric power is supplied to the heating resistor; and a plurality of second lead wires for connection between the heating resistor and the common electrode, the second lead wires being adjacent to the first lead wires, at least the first lead wires, the second lead wires and the common electrode being formed on the glaze layer; wherein the heating resistor is formed in the vicinity of an end surface of the substrate; intermediate pads provided at ends of the second lead wires and the common electrode are formed while being successively spaced apart from the heating resistor; and the intermediate pads are connected, through bonding wires jumping the common electrode, to IC pads connected to the driver IC formed on another substrate.

According to a second aspect of the present invention, there is provided a thick film thermal printing head including a substrate; an insulating glaze layer formed on the substrate; a heating resistor formed into a straight elongated shape; a driver IC for controlling energization of the heating resistor; a plurality of first lead wires for connection between the heating resistor and the driver IC, the first lead wires being formed parallel to each other; a common electrode serving as an intermediate power supply point through which electric power is supplied to the heating resistor; and a plurality of second lead wires for connection between the heating resistor and the common electrode, the second lead wires being adjacent to the first lead wires, at least the first lead wires, the second lead wires and the common electrode being formed on the glaze layer; wherein the heating resistor is formed in the vicinity of an end surface of the substrate; intermediate pads provided at ends of the first lead wires, the common electrode and IC pads connected to the driver IC are formed while being successively spaced apart from the heating resistor; and the intermediate pads are connected to the IC pads through bonding wires jumping the common electrode.

In each of these thick film thermal printing heads of the present invention, the heating resistor, the first lead wires, the second lead wires, the common electrode, the intermediate pads, the bonding wires and the IC pads may be covered with a wear resistant insulating protective layer.

According to a third aspect of the present invention, there is provided a thick film thermal printing head including a substrate; an insulating glaze layer formed on the substrate; a heating resistor formed into a straight elongated shape; a driver IC for controlling energization of the heating resistor; a plurality of first lead wires for connection between the heating resistor and the driver IC, the first lead wires being formed parallel to each other; a common electrode serving as an intermediate power supply point through which electric power is supplied to the heating resistor; and a plurality of second lead wires for connection between the heating resistor and the common electrode, the second lead wires being adjacent to the first lead wires, at least the first lead wires, the second lead wires and the common electrode being formed on the glaze layer; wherein the heating resistor is formed in the vicinity of an end surface of the substrate; intermediate pads provided at ends of the second lead wires and the common electrode are formed while being successively spaced apart from the heating resistor; the driver IC and IC pads connected to the driver IC are formed on an insulating protective layer with which the common electrode is covered; and the intermediate pads are connected to the IC pads through bonding wires jumping the common electrode.

In the thick film thermal printing head according to the second aspect of the invention, the heating resistor, the first lead wires, the second lead wires, the intermediate pads, the bonding wires and the IC pads may be covered with a wear resistant insulating protective layer.

The second object of the present invention can be achieved by a facsimile apparatus or a printer having the thick film thermal printing head provided in the first, second or third aspect of the invention.

In each of the thick film thermal printing head according to the first, second or third aspect of the present invention, the second lead wires connecting the common electrode and the heating resistor formed on the substrate in the vicinity of an end surface thereof are directly connected to the heating resistor and the common electrode, and there is no insulating interlayer between the common electrode and the second lead wires and, hence, no through holes formed in the insulating interlayer. There is therefore no need to form through holes in such an insulating interlayer by a complicated high-cost process such as a photolithography process or the like. Consequently, a thick film thermal printing head in which the heating resistor is located in close proximity to the substrate end can easily be manufactured.

DESCRIPTION OF PREFERRED EMBODIMENTS

Figure 1:
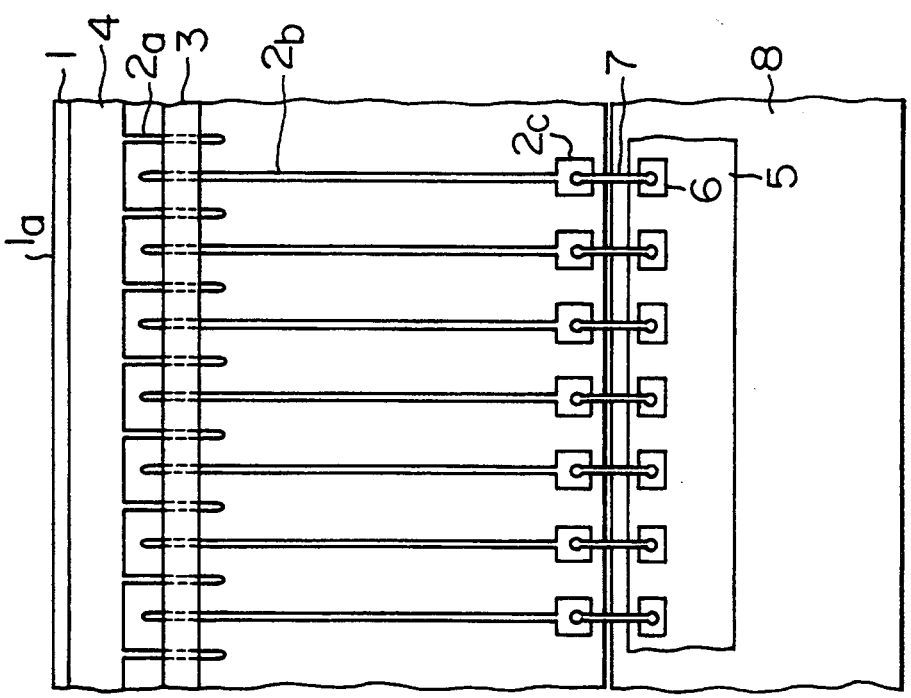
FIG. 1 is a diagram of the structure of a first embodiment of the present invention.

The first embodiment of the present invention will be described below with reference to FIG. 1.

A glass glaze layer is formed on a part or the whole of a substrate 1 formed of a ceramic or a metal. On this layer are formed lead wires $2a$ provided as second lead wires which are led from a heating resistor 3 and are connected to a common electrode 4 serving as a power source intermediate point to which a plus voltage is applied, and lead wires $2b$ provided as first lead wires which are led from the heating resistor 3 and are connected to a driver IC 5 through pads $2c$, and 6 and wires 7.

The heating resistor 3 is formed in the vicinity of one of opposite end surfaces of the substrate 1, and the lead wires $2a$ and $2b$ are formed so as to extend toward the other end surface of the substrate 1. The lead wires $2a$ and $2b$ and the common electrode 4 are formed by, for example, printing Au paste patterns on the whole upper surface of the substrate 1 or the glaze layer and using a photolithography process after firing. The lead wires $2b$ extending from the heating resistor 3 have wire bonding pads $2c$ formed at their ends. The pads $2c$ are connected to wire bonding pads 6 formed on a separate substrate 8, on which the driver IC 5 is mounted, at positions corresponding to those of the pads $2c$ by wire bonding using bonding wires 7 (hereinafter referred to simply as wires).

The heating resistor 3 is thereby connected to the driver IC 5. The driver IC 5 is bonded to the upper surface of the substrate 8 formed of glass epoxy or polyimide. The substrate 1 and the substrate 8 are bonded to an upper surface of a heat sink (not shown) formed of aluminum while being disposed adjacent to each other, as shown in FIG. 1. Further, the heating resistor 3, the lead wires $2a$ and $2b$, the common electrode 4, the intermediate pads 2C, the boundary wires 7, and the IC pads 6 are covered with a wear resistant insulating protective layer (not shown).

The operation of this embodiment will be described below with reference to FIG. 1. If a transistor (not shown) corresponding to the pad $6a$ of the driver IC 5 is turned on, a current flowing through the lead wires $2a1$ and $2a2$ out of the common electrode 4 to which the plus voltage is applied flows through the regions of the heating resistor portions $3a$ and $3b$ to lead wire $2b1$ while generating heat therein as Joule's heat. The current flowing into the lead wire $2b1$ flows to the driver IC pad $6a$ through the pad $2c1$ provided at the end of the wire $2b1$ and through the wire $7a$. The current flowing into the pad $6a$ flows to the ground through the transistor of the driver IC which corresponds to the pad $6a$ and which is on. It is thus possible to produce heat in the heating resistor portions $3a$ and $3b$ by turning on the transistor corresponding to the pad $6a$.

The heating resistor portions $3c$ and $3d$ can be heated in the same manner; a transistor corresponding to the pad $6b$ on the driver IC is turned on, and a current flows out of the common electrode 4 through the lead wires $2a2$ and $2a3$, the heating resistor portions $3c$ and $3d$ and the lead wire $2b2$ and flows to the pad $6b$ through the pad $2c2$ and the wire $7b$ while generating heat in the heating resistor portions $3c$ and $3d$. The other heating resistor portions can also be operated in the same manner for the functions of the thermal printing head.

The effects of this embodiment will be described below by comparing the structure of this embodiment shown in FIG. 1 with that of the conventional head shown in FIG. 2.

Figure 2:
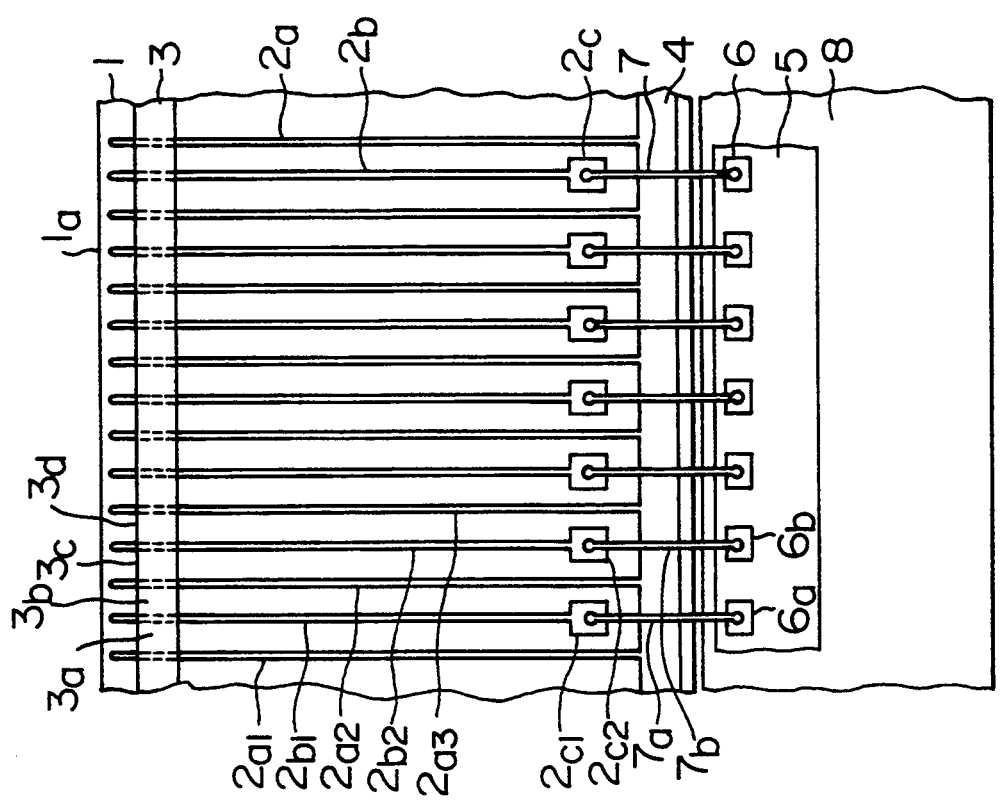
FIG. 2 is a diagram of the structure of a conventional thick film thermal printing head.

FIG. 2 shows the basic structure of the conventional thick film thermal printing head. The difference between this printing head and the embodiment of the present invention shown in FIG. 1 resides in the position of the common electrode 4 to which a plus voltage is applied. In the conventional thick film thermal printing head shown in FIG. 2, the common electrode 4 is positioned on the side of the heating resistor 3 remote from the driver IC 5. The common electrode 4 is therefore formed between an upper end 1a of the substrate 1 and the heating resistor 3, so that the heating resistor 3 cannot be brought closer to the upper end 1a of the substrate 1 owing to interference with the common electrode 4. In contrast, in the embodiment of the present invention, the common electrode 4 can be formed on the same side as the driver IC 5, and the heating resistor 3 can be formed adjacent to the upper end 1a of the substrate 1 since there is no obstruction therebetween.

Several effects obtained by minimizing the distance between the heating resistor and the upper end of the substrate as described with respect to the embodiment will be described below.

Figure 5:
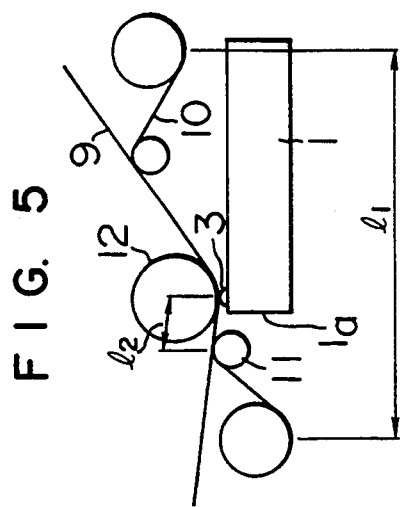
FIG. 5 is a diagram of the mechanism of a thermal transfer printer having the thick film thermal printing head in accordance with the first embodiment of the present invention.
Figure 4:
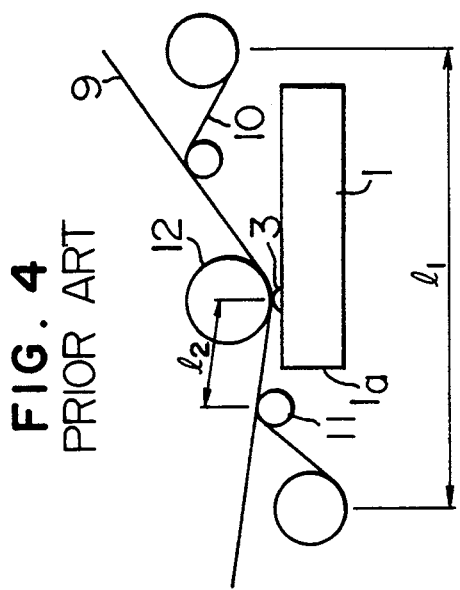
FIG. 4 is a diagram of the mechanism of a thermal transfer printer having the conventional thick film thermal printing head.
Figure 6:
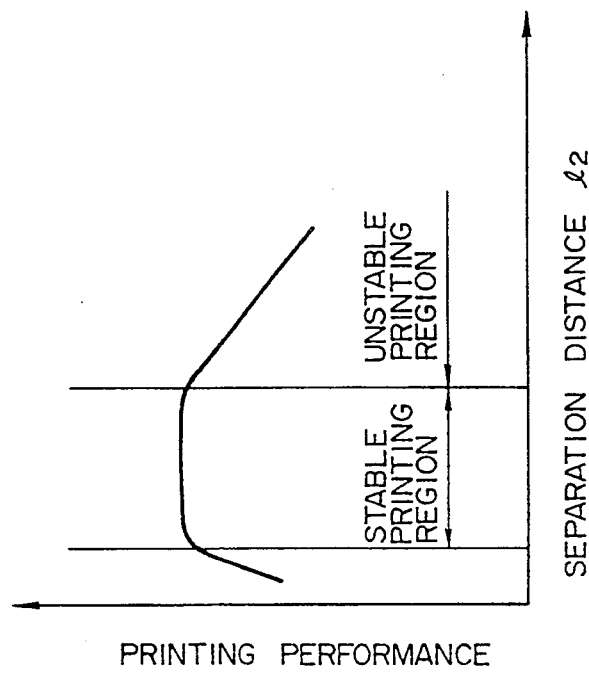
FIG. 6 is a diagram of the relationship between the printing performance and the separation distance of the thermal transfer printer shown in FIG. 6.

FIG. 4 shows the mechanism of a thermal transfer printer with a thermal printing head having the conventional structure shown in FIG. 2, and FIG. 5 shows the mechanism of a thermal printing head having the structure described above with respect to the embodiment. In both the mechanisms of FIGS. 4 and 5, a sheet 9 to which an image is transferred is superposed on an ink sheet 10 and is supplied to the gap between the heating resistor 3 formed on the substrate 1 and a platen roller 12 having the heating resistor 3, where printing is effected. The transfer sheet 9 and the ink sheet 10 transported out of the printing section are separated from each other by a separation roller 11. In each of FIGS. 4 and 5, $l_1$ represents the distance between rollers of cassettes in which ink sheets are accommodated, and $l_2$ represents the distance between the position of printing on the transfer sheet and the ink sheet by the thermal printing head and the position at which these sheets are separated by the separation roller. From the comparison between FIGS. 4 and 5, it is understood that the thermal printing head having the structure in accordance with the described embodiment enables a reduction in the distance $l_1$ as compared with the conventional thermal printing head. It is therefore possible to reduce the overall-size of the thermal transfer printer by using the thermal printing head of the above-described embodiment. FIG. 6 shows the relationship between printing performance and the distance $l_2$ between the printing position on the thermal printing head and the position at which the transfer sheet and the ink sheet are separated by the separation roller. In the thick film thermal printing head in accordance with the embodiment of the present invention, $l_2$ is in a stable printing region, while in the conventional thick film thermal printing head shown in FIG. 2, $l_2$ is in a unstable printing region. In the thermal transfer printer having the conventional thermal printing head, $l_2$ is large, as shown in FIG. 4, so that the shape of each pixel is deformed and that the printing performance is unsatisfactory. In contrast, in the thermal transfer printer having the thermal printing head in accordance with the described embodiment, $l_2$ can be shortened, so that the pressing force is uniform and that the pixels have suitable shapes, thus improving the printing performance. Thus, it is also possible to improve the printing performance of the thermal transfer printer by using the thermal printing head in accordance with the described embodiment.

Figure 3:
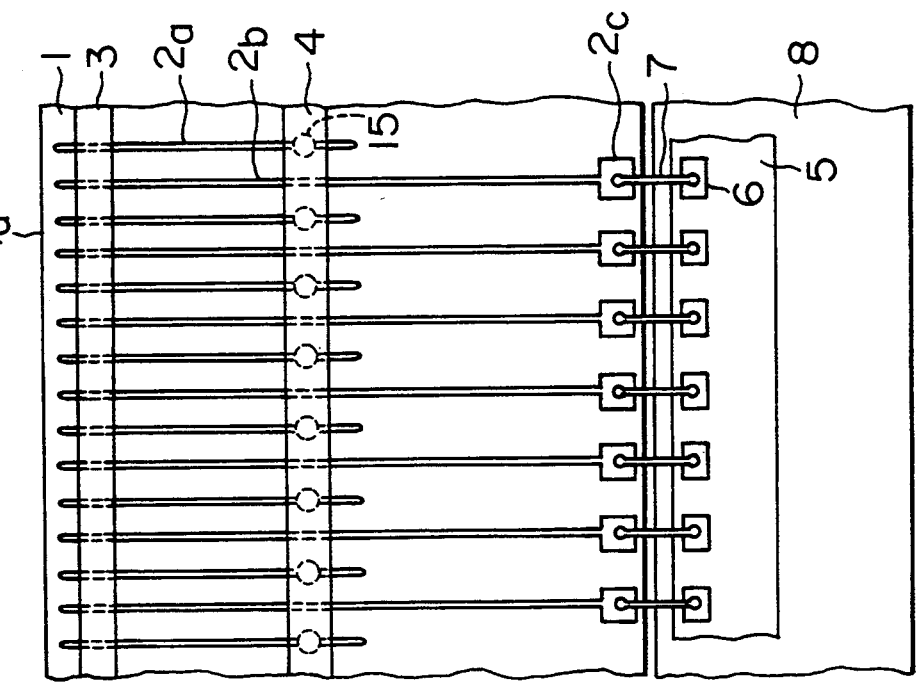
FIG. 3 is a diagram of the structure of a known thick film thermal printing head most closely allied to the present invention.

Further, other specific effects of the described embodiment will be described below in comparison with the conventional thick film thermal printing head shown in FIG. 3 which has a structure in which the heating resistor is formed in close proximity with the upper end of the base. In the thermal printing head shown in FIG. 3, the common electrode 4 and the driver IC 5 are on the same side of the heating resistor 3, as in the case of the described embodiment, and there is no obstructive element between the upper end 1a of the substrate and the heating resistor 3. The heating resistor can therefore be brought close to the upper end of the substrate as in the described embodiment. However, the position of the common electrode 4 of this printing head is quite different from that of the described embodiment. That is, in the embodiment of the present invention, the wires 7 connect the pads 2c and 6 without contacting the common electrode 4, whereby a structure equivalent to a two-layer wiring structure can easily be obtained. In addition, since the common electrode 4 can be formed on the substrate 1 or the glaze layer formed on the substrate 1 like the lead wires 2a and 2b, there is no need for any complicated process for forming through holes. In the thermal printing head based on the prior art as shown in FIG. 3, the common electrode 4 must be electrically connected to the lead wires 2a while being electrically insulated from the lead wires 2b. To achieve this special construction, a process is required which includes forming lead wires 2a and 2b on substrate 1 or a glaze layer on the substrate 1, forming an insulating interlayer on these leads, forming through holes 15 in the insulating interlayer so that the holes extend to the lead wires 2a, and forming common electrode 4 on the insulating interlayer so that the common electrode is connected to the lead wires. That is, the common electrode 4 is formed not on the substrate 1 or the glaze layer formed on the substrate 1 but on the insulating interlayer formed on the lead wires 2a and 2b, thus forming a complicated multilayer structure. A photolithography process is also required to form the through holes, and the overall process for obtaining the thermal printing head shown in FIG. 3 is very complicated. The yield at which the printing heads are manufactured is low and the manufacture cost of each head is high.

For the thermal printing head structure proposed with respect to the embodiment, wire bonding, which is a very simple means, is used to achieve substantially the same effects as a two-layer structure without using any complicated through hole forming process such as that described above. It is thereby possible to manufacture, at a high yield, and at a reduced cost, a thick film thermal printing head in which the heating resistor is located in close proximity to the upper end of the base.

Figure 7:
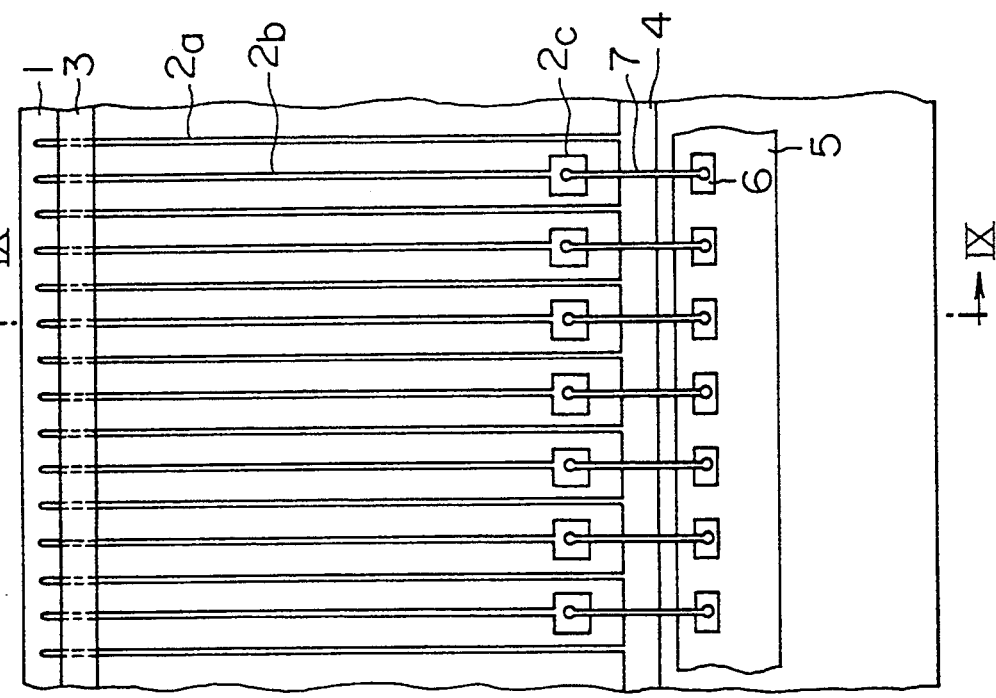
FIG. 7 is a diagram of the structure of a second embodiment of the present invention.

The second embodiment of the present invention will be described below with reference to FIG. 7. A glass layer is formed on a part or the whole of a substrate 1 formed of a ceramic or a metal. On this layer are formed lead wires 2a led from a heating resistor 3 and connected to a common electrode 4, and lead wires 2b led from the heating resistor 3 and connected to a driver IC 5 through pads 2c, and 6 and wires 7. The lead wires 2a and 2b and the common electrode 4 are formed by, for example, printing Au paste patterns on the whole upper surface of the substrate 1 or the glaze layer and using a photolithography process after firing. The lead wires 2b extending from the heating resistor 3 have pads 2c formed at their ends on the driver IC 5 side. The pads 2c are connected to pads 6 provided on the driver IC 5 at positions corresponding to those of the pads 2c by wire bonding using bonding wires 7, thereby being connected to the driver IC 5. While in the first embodiment the driver IC 5 is bonded to the upper surface of the substrate 8 provided separately from the substrate 1 and formed of glass epoxy or polyimide, the driver IC 5 of this embodiment is bonded to the ceramic or metallic substrate 1. The operation of this embodiment is the same as that of the first embodiment described above. The effects of this embodiment are the same as those of the first embodiment described above. That is, a thick film thermal printing head in which the heating resistor is positioned in close proximity to the upper end of the substrate can be manufactured at a low cost without using any two-layer wiring structure having through holes. Further, the head structure of this embodiment is improved in reliability. That is, since the lead wires 2b and the driver IC 5 are formed on or bonded to the same substrate surface, there is no possibility of misalignment of the positions of the wire bonding pads 2c and 6, which may be caused by an increase in the temperature of the substrate 1 during printing if there is a difference between the extents of thermal expansion of the substrates on which the pads 2c and 6 are provided.

The third embodiment of the present invention will be described below with reference to FIG. 8. This embodiment is formed of the same components as those of the second embodiment shown in FIG. 7, but differs from the second embodiment as described below.

In the second embodiment, the common electrode 4 is positioned between the driver IC 5 and the wire bonding pads 2c formed at the ends of the lead wires 2b extending from the resistor, and the bonding wires 7 connect the pads 2c and the wire bonding pads 6 on the driver IC by jumping the common electrode 4. Since the common electrode 4 and the wire 7 do not spatially contact each other, there is no need to specially form an insulating protective film on the common electrode 4 (which, of course, can be formed freely), and the whole of the driver IC and the wires 7 may be covered with a chip coating consisting of, for example, a silicone resin to improve the reliability. Additionally, a wear resistant insulating protective layer as described in connection with the first embodiment may be utilized.

Figure 8:
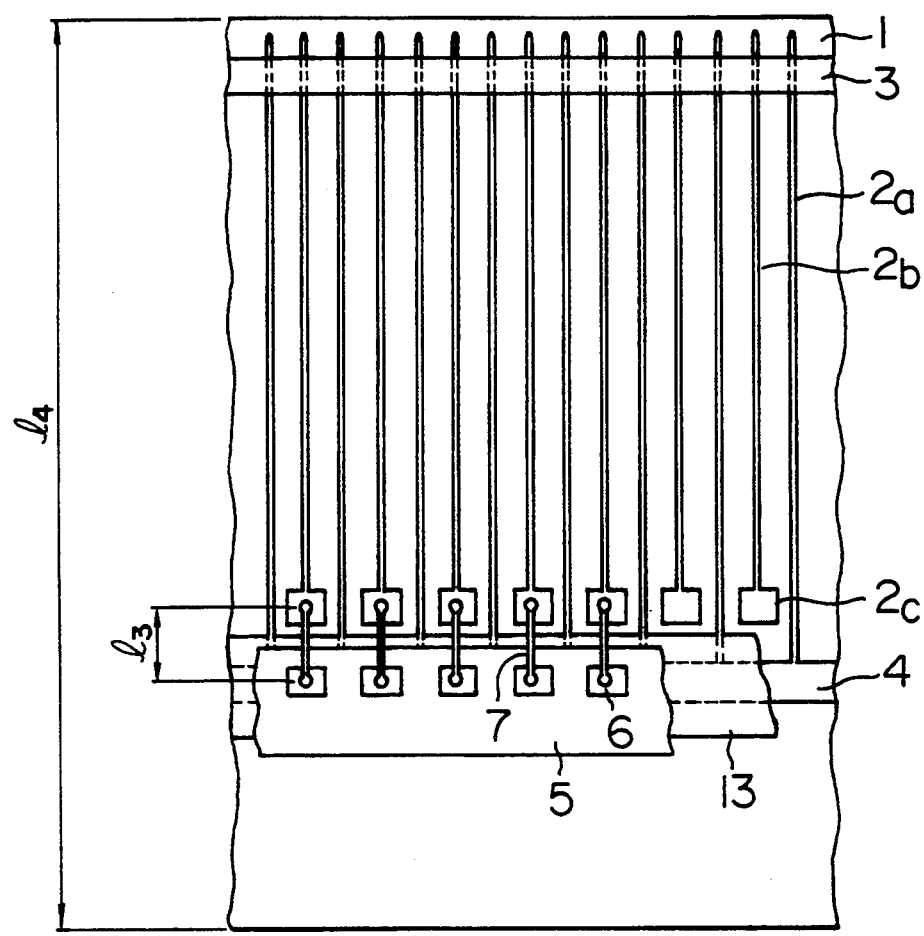
FIG. 8 is a diagram of the structure of a third embodiment of the present invention.
Figure 9:
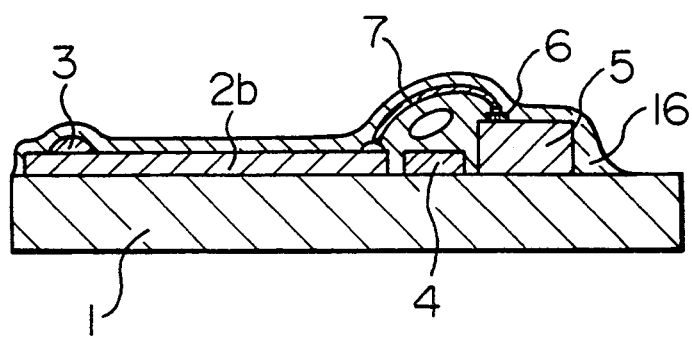
FIG. 9 is a cross-sectional view of the structure of FIG. 7 taken along line IX—IX.

In contrast, in the third embodiment shown in FIG. 8, a protective layer of glass having an electrically insulating property is formed over the common electrode 4 as indicated at 13, and the driver IC 5 is bonded to this protective layer. The common electrode 4 is located not between the pads 2c and the driver IC 5 but under the layer of the driver IC 5, and is electrically insulated from the driver IC 5 by the insulating film 13. In this embodiment, as well as the first and second embodiments, a thick film thermal printing head in which the heating resistor is positioned in close proximity to the upper end of the substrate can be manufactured at a low cost without using any two-layer wiring structure having through holes. This embodiment has other advantages in that since the wires 7 connect the pads 2c and the driver IC 5 without jumping the common electrode 4, the bonding distance $l_3$ which is the distance between the centers of the pads 2c and 6 can be reduced in comparison with the first and second embodiment, thereby reducing the amount of used bonding wire to half as well as the fraction defective of wire bonding. In addition, since the area on the substrate 1 where the common electrode 4 is formed can be included in the area where the driver IC is formed, the width $l_4$ of the substrate 1 can be reduced in comparison with the thermal printing heads of the first and second embodiments, thereby enabling manufacture of a smaller thick film thermal printing head.

In this embodiment, it is not necessary to fully cover the common electrode 4 with the driver IC 5, and only a part of the common electrode 4 may be located right below the driver IC 5. Additionally, a wear resistant insulating protective layer as described in connection with the first embodiment may be utilized.

As described above, the present invention provides a thick film thermal printing head in which a heating resistor is formed in the vicinity of an end surface of a substrate base on a glaze layer formed on the base; intermediate pads and a common electrode successively spaced apart from the heating resistor are formed; the heating resistor and the intermediate pads are connected by first lead wires; the heating resistor and the common electrode are connected by second lead wires adjacent to the first lead wires; and the intermediate pads and pads on the IC are connected by wires which extend over the common electrode without contacting the same. It is therefore possible to manufacture a thick film thermal printing head in which the heating resistor is positioned in the vicinity of the end surface of the substrate without requiring any two-layer wiring structure in which an insulating interlayer is provided between the common electrode and the second lead wires, and in which through holes are formed in the insulating interlayer structure by a complicated high-cost process using photolithography or the like. Therefore the manufacture process can be simplified and the manufacture cost can be reduced. It is also possible to provide a thermal transfer facsimile apparatus or a thermal transfer printer reduced in size and improved in performance by using the thick film thermal printing head of the present invention.

What is claimed is:

1. A facsimile apparatus comprising means for enabling a facsimile operation including:
   a substrate;
   an insulating glaze layer formed on said substrate;
   a heating resistor formed into a straight elongated shape;
   a driver IC for controlling energization of said heating resistor;
   a plurality of first lead wires for connection between said heating resistor and said driver IC, said first lead wires being formed parallel to each other;
   a common electrode serving as an intermediate power supply point through which electric power is supplied to said heating resistor; and
   a plurality of second lead wires for connection between said heating resistor and said common electrode, said second lead wires being adjacent to said first lead wires, at least said first lead wires, said second lead wires and said common electrode being formed on said glaze layer;
   wherein one of (a) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires and said common electrode are formed while being successively spaced apart from said heating resistor so that said intermediate pads are provided between said heating resistor and said common electrode; and said intermediate pads are connected, through bonding wires jumping said common electrode, to IC pads connected to said driver IC formed on another substrate, (b) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires between said heating resistor and said common electrode, said common electrode and IC pads connected to said driver IC are formed while being successively spaced apart from said heating resistor; and said intermediate pads are connected to said IC pads through bonding wires jumping said common electrode;

(c) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires and said common electrode are formed while being successively spaced apart from said heating resistor so that said intermediate pads are provided between said heating resistor and said common electrode; said driver IC is mounted on an insulating protective layer with which said common electrode is covered; and said intermediate pads are connected to IC pads on said driver IC by bonding wires; and (d) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires between said heating resistor and said common electrode; said common electrode and at least one of said intermediate pads and IC pads connected to said driver IC are formed while being spaced apart from said heating resistor; and said intermediate pads are connected to said IC pads by bonding wires.

2. A facsimile apparatus according to claim 1, wherein said heating resistor, said first lead wires, said second lead wires, said intermediate pads, said bonding wires and said IC pads are covered with a wear resistant insulating protective layer.

3. A facsimile apparatus according to claim 2, wherein said common electrode is covered with said wear resistant insulating protective layer.

4. A printer apparatus comprising means for enabling a printing operation including:
a substrate;
an insulating glaze layer formed on said substrate;
a heating resistor formed into a straight elongated shape;
a driver IC for controlling energization of said heating resistor;
a plurality of first lead wires for connection between said heating resistor and said driver IC, said first lead wires being formed parallel to each other;
a common electrode serving as an intermediate power supply point through which electric power is supplied to said heating resistor; and
a plurality of second lead wires for connection between said heating resistor and said common electrode, said second lead wires being adjacent to said first lead wires, at least said first lead wires, said second lead wires and said common electrode being formed on said glaze layer;
wherein one of
(a) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires and said common electrode are formed while being successively spaced apart from said heating resistor so that said intermediate pads are provided between said heating resistor and said common electrode; and said intermediate pads are connected, through bonding wires jumping said common electrode, to IC pads connected to said driver IC formed on another substrate.

(b) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires between said heating resistor and said common electrode, said common electrode and IC pads connected to said driver IC are formed while being successively spaced apart from said heating resistor; and said intermediate pads are connected to said IC pads through bonding wires jumping said common electrode;

(c) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires and said common electrode are formed while being successively spaced apart from said heating resistor so that said intermediate pads are provided between said heating resistor and said common electrode; said driver IC is mounted on an insulating protective layer with which said common electrode is covered; and said intermediate pads are connected to IC pads on said driver IC by bonding wires; and (d) said heating resistor is formed as an integral member extending in a straight line in a vicinity of an end surface of said substrate so as to cover a portion of each of said plurality of first lead wires and a portion of each of said plurality of second lead wires; intermediate pads provided at ends of said first lead wires between said heating resistor and said common electrode; said common electrode and at least one of said intermediate pads and IC pads connected to said driver IC are formed while being spaced apart from said heating resistor; and said intermediate pads are connected to said IC pads by bonding wires.

5. A printer apparatus according to claim 4, wherein said heating resistor, said first lead wires, said second lead wires, said intermediate pads, said bonding wires and said IC pads are covered with a wear resistant insulating protective layer.

6. A printer apparatus according to claim 5, wherein said common electrode is covered with said wear resistant insulating protective layer.

7. A thick film thermal printing head comprising:
a substrate;
an insulating glaze layer formed on said substrate;
a heating resistor disposed on said glaze layer; and
a driver IC for controlling energization of said heating resistor;
a plurality of first lead wires electrically connected to said heating resistor and connecting said heating resistor with said driver IC;
a common electrode serving as an intermediate power supply point through which electric power is supplied to said heating resistor;
a plurality of second lead wires disposed in parallel with said first lead wires and electrically connecting said heating resistor with said common electrode;
a plurality of bonding wires electrically connecting said first lead wires with said driver IC;
at least said first lead wires, said common electrode and said second lead wires being disposed on said glaze layer; and
a resistant insulating protective layer covering said common electrode;
wherein said driver IC is disposed on said resistant insulating protective layer; and said common electrode, said first lead wires and said heating resistor are formed on one substrate.

8. A thick film thermal printing head according to claim 7, wherein the resistant insulating protective layer is a wear resistant insulating protective layer.

9. A thick film thermal printing head comprising:
a substrate;
an insulating glaze layer formed on said substrate;
a heating resistor disposed on said glaze layer; and
a driver IC for controlling energization of said heating resistor;
a plurality of first lead wires electrically connected to said heating resistor and connecting aid heating resistor with said driver IC;
a common electrode serving as an intermediate power supply point through which electrical power is supplied to said heating resistor;
a plurality of second lead wires disposed in parallel with said first lead wires and electrically connecting said heating resistor with said common electrode;
a plurality of bonding wires electrically connecting said first lead wires with said driver IC;
at least said first lead wires, said common electrode and said second lead wires being disposed on said glaze layer;
a resistant insulating protective layer covering said common electrode;
wherein said driver IC is disposed on said resistant insulating protective layer; and said heating resistor is formed as an integral member extending in a straight line so as to electrically connect said first lead wires and said second lead wires.

10. A thick film thermal printing head according to claim 9, wherein said heating resistor and said driver IC are formed on one substrate.

11. A thick film thermal printing head according to claim 9, wherein the resistant insulating protective layer is a wear resistant insulating protective layer.

12. A thick film thermal printing head comprising:
a substrate,
an insulating glaze layer formed on aid substrate;
a heating resistor disposed on said glaze layer;
a driver IC for controlling energization of said heating resistor;
a plurality of first lead wires electrically connected to said heating resistor and connecting said heating resistor with said driver IC;
a common electrode serving as an intermediate power supply point through which electric power is supplied to said heating resistor;
a plurality of second lead wires disposed in parallel with said first lead wires and electrically connecting said heating resistor with said common electrode;
a plurality of bonding wires electrically connecting said first lead wires with said driver IC;
at least said first lead wires, said common electrode and said second lead wires being disposed on said glaze layer;
a resistant insulating protective layer covering said common electrode;
wherein said driver IC is disposed on said resistant insulating protective layer; and a plurality of bonding pads are disposed on said driver IC in a position corresponding to said common electrode.

13. A thick film thermal printing head according to claim 12, wherein said heating resistor and said driver IC are formed on one substrate.

14. A thick film thermal printing head according to claim 13, wherein said heating resistor is formed as an integral member extending in a straight line so as to electrically connect said first lead wires and said second lead wires.

15. A thick film thermal printing head according to claim 12, wherein the resistant insulating protective layer is a wear resistant insulating protective layer.

16. A method of producing a thick film thermal printing head comprising the steps of:
forming a glaze layer on a substrate;
forming a plurality of first lead wires, a plurality of second wires and a common electrode on said glaze layer in such a manner that said first lead wires and said second lead wires are disposed in parallel with each other, that said common electrode is disposed in perpendicular to the longitudinal direction of said first and second lead wires, and that said second lead wires are electrically connected to said common electrode;
forming a heating resistor layer so as to cover a portion of each of said plurality of first lead wires and a portion of each of said plurality of second lead wires;
forming a resistant insulating protective layer so as to cover said common electrode;
mounting a driver IC on said resistant insulating protective layer; and attaching a plurality of bonding wires each of which electrically connects each of said first lead wires with said driver IC.

17. A method of producing a thick film thermal printing head according to claim 16, wherein said first and second lead wires and said common electrode are formed on one substrate.

18. A method of producing a thick film thermal printing head according to claim 16, wherein the resistant insulating protective layer is a wear resistant insulating protection layer.

* * * * *